(12) United States Patent
El-Mellouhi et al.

(10) Patent No.: US 11,866,344 B2
(45) Date of Patent: Jan. 9, 2024

(54) CESIUM-NIOBIUM-CHALCOGENIDE COMPOUNDS AND SEMICONDUCTOR DEVICES INCLUDING THE SAME

(71) Applicants: Trinity College Dublin, Dublin (IE); Qatar Foundation for Education, Science and Community Development, Doha (QA)

(72) Inventors: Fadwa El-Mellouhi, Doha (QA); Heesoo Park, Doha (QA); Nouar Tabet, Doha (QA); Fahhad Alharbi, Doha (QA); Stefano Sanvito, Dublin (IE)

(73) Assignees: Trinity College Dublin, Dublin (IE); Qatar Foundation for Education, Science and Community Development, Doha (QA)

( * ) Notice: Subject to any disclaimer, the term of this patent is extended or adjusted under 35 U.S.C. 154(b) by 827 days.

(21) Appl. No.: 16/967,606

(22) PCT Filed: Feb. 5, 2019

(86) PCT No.: PCT/QA2019/050002
§ 371 (c)(1),
(2) Date: Aug. 5, 2020

(87) PCT Pub. No.: WO2019/156580
PCT Pub. Date: Aug. 15, 2019

(65) Prior Publication Data
US 2021/0269326 A1 Sep. 2, 2021

Related U.S. Application Data

(60) Provisional application No. 62/627,494, filed on Feb. 7, 2018, provisional application No. 62/626,964, filed on Feb. 6, 2018.

(51) Int. Cl.
*C01G 33/00* (2006.01)
*C01B 19/00* (2006.01)
(Continued)

(52) U.S. Cl.
CPC .......... *C01G 33/006* (2013.01); *C01B 19/002* (2013.01); *H01L 31/0264* (2013.01); *H01L 31/036* (2013.01); *C01P 2002/30* (2013.01)

(58) Field of Classification Search
CPC ... C01G 33/006; C01B 19/002; H01L 31/036; C01P 2002/30
(Continued)

(56) References Cited

FOREIGN PATENT DOCUMENTS

CN 104449705 A * 3/2015

OTHER PUBLICATIONS

CN-104449705-A English translation (Year: 2015).*

* cited by examiner

*Primary Examiner* — Anita Nassiri-Motlagh
(74) *Attorney, Agent, or Firm* — K&L Gates LLP (57) ABSTRACT

Cesium-niobium-chalcogenide compounds and a semiconductor device are provided. The cesium-niobium-chalcogenide compound is selected from the group consisting of $CsNbS_3$, $CsNbSe_3$, and $CsNbO_{x-3}Q_x$, where Q is S or Se, and x is 1 or 2, and includes an edge-shared orthorhombic crystal structure. In one embodiment, the semiconductor device includes a cathode layer, an anode layer, and an active layer disposed between the cathode layer and the anode layer, and the active layer includes the cesium-niobium-chalcogenide compound.

16 Claims, 11 Drawing Sheets

(51) Int. Cl.
*H01L 31/036* (2006.01)
*H01L 31/0264* (2006.01)
(58) Field of Classification Search
USPC .......................................................... 423/508
See application file for complete search history.

FIG. 1(a) $c_{CS}$-CsNbO$_3$

FIG. 1(b) $t_{CS}$-CsNbO$_3$

FIG. 1(c) $o_{ES}$-CsNbO$_3$

FIG. 4(a) VBM  FIG. 4(b) CBM

FIG. 10 (a) $t_{CS}$-CsNbO$_3$

FIG. 10 (b) $o_{ES}$-CsNbO$_3$

FIG. 10 (c) $t_{CS}$-CsNbS$_3$

FIG. 10 (d) $o_{ES}$-CsNbSe$_3$

CESIUM-NIOBIUM-CHALCOGENIDE COMPOUNDS AND SEMICONDUCTOR DEVICES INCLUDING THE SAME

CROSS-REFERENCE TO RELATED APPLICATIONS

The present application is a National Stage filing under 35 U.S.C. 371 of International Application No. PCT/QA2019/050002, filed on Feb. 5, 2019 which claims priority to U.S. Provisional Patent Application No. 62/626,964, filed Feb. 6, 2018 and U.S. Provisional Patent Application No. 62/627,494, filed Feb. 7, 2018, the disclosures of which are incorporated into this specification by reference in their entirety.

BACKGROUND

Lead-halide perovskites have been used in the field of photovoltaics (PV), owing to their high power conversion efficiencies (PCE) associated with a low-cost chemical processing synthesis. Specifically, the methylammonium lead iodide perovskite (MAPbI$_3$) has drawn attention as an efficient material for photovoltaic applications displaying PCE of up to 22.1%. However, the pace of the conversion efficiencies has slowed down over the past few years, as the theoretical limit has been approached. Several modifications of MAPbI$_3$ are experiencing intrinsic instability despite the enhancement of the efficiencies. Thus, efforts are being devoted to solve the two main challenges that stand against their deployment in the PV market, namely, the degradation under operating conditions and the toxicity of the lead-containing compounds.

SUMMARY

According to one non-limiting aspect of the present disclosure, an example embodiment of a cesium-niobium-chalcogenide compound is selected from the group consisting of CsNbS$_3$, CsNbSe$_3$, and CsNbO$_{x-3}$Q$_x$ (Q=S, Se, and x=1, 2) compounds, and comprises an edge-shared orthorhombic crystal structure.

According to another non-limiting aspect of the present disclosure, an example embodiment of a semiconductor device includes a cathode layer, an anode layer, and an active layer disposed between the cathode layer and the anode layer. The active layer includes a cesium-niobium-chalcogenide compound selected from the group consisting of CsNbS$_3$, CsNbSe$_3$, and CsNbO$_{x-3}$Q$_x$ (Q=S, Se, and x=1, 2) compounds, and the cesium-niobium-chalcogenide compound comprises an edge-shared orthorhombic crystal structure. In addition to stability, the new cesium-niobium-chalcogenide compounds possess suitable properties to be used as photo absorbing layer associated with strong aborption properties at the visible light region.

Additional features and advantages are described herein, and will be apparent from the following Detailed Description and the figures.

BRIEF DESCRIPTION OF THE DRAWINGS

Features and advantages of the cesium-niobium-chalcogenide compounds and the semiconductor devices including the same described herein may be better understood by reference to the accompanying drawings in which:

FIGS. 1(a)-1(c) are relaxed structures of different CsNbO$_3$ polymorphs.

FIGS. 2(a)-2(e) are relaxed structures of 2 adjacent building blocks containing MO$_4$Q$_2$ and MO$_2$Q$_4$ (Q=S, Se, Te), in t$_{CS}$- and o$_{ES}$-CsNbO$_{3-x}$Q$_x$: FIG. 2(a) t$_{CS}$-CsNbO$_2$Q$_{ap}$ where Q is at the apical site, FIG. 2(b) t$_{CS}$-CsNbO$_2$Q$_{eq}$ where Q is at the equatorial site, FIG. 2(c) t$_{CS}$-CsNbOQ$_2$, FIG. 2(d) o$_{ES}$-CsNbO$_2$Q, FIG. 2(e) o$_{ES}$-CsNbOQ$_2$. Only Nb, O, and S are depicted for clarity. t$_{CS}$-CsNbO$_2$Q$_{eq}$ is more favorable than t$_{CS}$-CsNbO$_2$Q$_{ap}$. FIG. 2(f) is a graph plotting energies above the convex hull for CsNbO$_{3-x}$Q$_x$ (Q=S, Se, or Te, and x=1, 2, or 3).

FIGS. 9(a)-9(c) are graphs plotting calculated optical properties of O$_{ES}$-CsNbS$_3$ by using HSE06 functional.

The reader will appreciate the foregoing details, as well as others, upon considering the following detailed description of certain non-limiting embodiments of the of the present disclosure including cesium-niobium-chalcogenide compounds and the semiconductor devices including the same. The reader may also comprehend certain of such additional details upon using same including the cesium-niobium-chalcogenide compounds and the semiconductor devices described herein.

DETAILED DESCRIPTION

Until recently, most of the focus in searching for new photoactive materials with a robust power conversion efficiency was on three-dimensional (3D) connected networks of metal cations and anions owing to the efficient charge separation. This industrious effort targeting 3D connected networks with the perovskite structure is motivated by the proposed correlation between crystallographic network connectivity and the electronic dimensionality favoring homogeneous optical properties and charge carrier transport. At the same time, efforts toward stabilizing the hybrid perovskites have led to the introduction of larger cations such as $(HOOC(CH_2)_4NH_3)_2$. These break the 3D connectivity of the $PbI_6$ octahedra producing significantly more stable 2D-3D perovskite networks. Some 2D-3D perovskite networks show 11.2% efficiency and they are stable for more than 10,000 hours (1 year) with zero loss in performances measured under controlled standard conditions. Recently, photo-absorbing compounds with lower-dimensional polyhedral connectivity, which is distinguished from conventional cubic perovskites, have been utilized in PV devices. Such lower-dimensional polyhedral connectivity networks might suffer from charge transport properties inferior to those at the 3D polyhedral connectivity perovskites, yet their successful operation in PV devices opens the door for the exploration of non-perovskite materials. Solar cells based on 2D $(CH_3NH_3)_2Pb(SCN)_2I_2$ perovskites have achieved decent power conversion efficiency and showed a superior defect tolerance with the tendency to exhibit p-type conductivity with a relatively long carrier lifetime.

Among these efforts, there has also been progress in reducing the large band gaps of perovskite oxides to match the visible light radiation spectrum. These efforts are motivated by the fact that perovskite oxides are more thermodynamically stable than hybrid perovskite halides, despite their large band gaps, usually above the visible spectrum absorption range. Alkali metals such as Li, Na, K, Rb and Cs have been reported to incorporate into monovalent-cation site of the $MNbO_3$, where M are alkali metals. They have been synthesized in various crystallographic phases. The increase in atomic number and hence cationic radius, namely $Rb^+>K^+>Na^+>Li^+$, results in the cubic perovskite becoming less stable in favor of orthorhombic or tetragonal perovskite phases. However, a further increase in the cationic radius to that of Cs, to form $CsNbO_3$, results in breaking into non-perovskite structures, which are experimentally reported. The crystal structure features edge-sharing octahedra in $CsNbO_3$ forming quasi-one-dimensional (quasi-1D) chain networks.

Previous high-throughput density functional theory (DFT) studies to simulate the perovskite structure of $CsNbO_3$ have reported that it has a phase obtained by deforming the cubic perovskite structure. In the present disclosure, the polymorphism of $CsNbO_3$ and the thermodynamic stability of 3D-connected network perovskite structures as well as their energetic competition with experimentally known polymorphs, where the octahedra form networks of quasi-1D connectivity are assessed using DFT. The hybrid organic-inorganic perovskites are believed to surpass the fully inorganic ones. The final goal of this design strategy is to provide non-toxic niobate compounds to accommodate organic cations with ionic radius comparable to $Cs^+$, such as methylammonium ($CH_3NH_3^+$). In addition, the present disclosure aims at reducing the band gap of $CsNbO_3$ polymorphs by replacement of oxygen with chalcogen ions at the anion sites. While comparing the chemical composition of $CsNbO_{3-x}Q_x$ (Q=S, Se, Te, and x=1, 2, 3) in various polymorphs where polyhedral network are formed differently, the present inventors found that the optical absorption can be enhanced in low-dimensional compounds by introducing chalcogens.

The structural stability of perovskite compounds strongly depends on the ionic radii of its constituents. In the present disclosure, the photoactive properties of cesium-niobate and cesium-niobium-chalcogenide $CsNbO_{3-x}Q_x$ (Q=S, Se, Te, and x=0, 1, 2, 3) are improved as a function of the chalcogen content as well as the impact on the structural and thermodynamic stability. Perovskites of $CsNbO_3$ and their chalcogenized variations have not been reported experimentally. Elements in chalcogen group have 6 valence electrons, so they share with oxygen the same chemical bonds character. The anionic radii become larger with increasing the atomic number from 0, S, Se to Te.

The tolerance factor of the full chalcogen substituted oxygen cesium-niobates $CsNbQ_3$ (Q=S, Se, Te) indicate that t decreases from 1.06 to 1.04 and 1.03 for $CsNbS_3$, $CsNbSe_3$, and $CsNbTe_3$, respectively. Consequently, the perovskite chalcogenides are expected to be relatively more stable than perovskite oxides, as the Goldschmidt tolerance factor t approaches the ideal value of 1. Nonetheless, these reduced values of t of the perovskite chalcogenides still exceed the optimal tolerance factor to form a cubic structure, while at the same time they indicate better relative stabilities of the cubic perovskite structures compared to the full oxides.

The present inventors have explored the thermodynamic stabilities of $CsNbO_{3-x}Q_x$ (Q=S, Se, Te, and x=0, 1, 2, 3) polymorphs by constructing their phase diagram and by assessing their distance from the convex hull. DFT calculations were performed using the projector-augmented wave (PAW) method, as it is implemented in VASP code. The structures were fully relaxed with Perdew-Burke-Ernzerhof (PBE) formulation of the generalized gradient approximation (GGA) of the electron exchange and correlation energy. When optimizing the structures, the relaxation was conducted in two steps in order to compare the phases within a given stoichiometry. The cell relaxation within each space group was followed by full relaxation where both the ions and cell were optimized without any structural constraint, as the present inventors optimized the volume and the shape of the cell as well as the atomic structure. The energies and forces were converged within $1.0 \times 10^{-6}$ eV/atom and $1.0 \times 10^{-2}$ eV/A, respectively. The cutoff energy for the plane-waves was 520 eV. The k-points were sampled according to the Monkhorst-Pack automatic generation scheme with 6×6×6 for all unit cells. When the present inventors carried out HSE06 calculations for the band gap and the dielectric function calculations, k-points were sampled with a Gamma-centered 4×4×4 grid.

The linear programming (LP) algorithm was adopted to obtain the minimum at a given chemical composition, which is represented by linear relationships. For example, as all possible decomposition reactions including the constituent elements are taken into account, the energy above the convex hull of $CsNbO2_S$ can be calculated as, $\Delta E_{CH}(\text{CsNbO}_2\text{S}) =$ $E(\text{CsNbO}_2\text{S}) - \min_{c_i}\{c_1E(\text{Cs}) + c_2E(\text{Nb}) + c_3E(\text{O}_2) + c_4E(\text{S}_8) +$ $c_5E(\text{Cs}_{a_5}\text{Nb}_{b_5}) + c_6E(\text{Cs}_{a_5}\text{O}_{o_6}) + c_7E(\text{Cs}_{a_7}\text{S}_{s_7}) \ldots +$ $c_{n-1}E(\text{Cs}_{a_{n-1}}\text{Nb}_{b_{n-1}}\text{O}_{o_{n-1}}) + c_nE(\text{Cs}_{a_n}\text{Nb}_{b_n}\text{S}_{s_n})\},$ where all the energies are the total energy of the corresponding stable compounds. In general, the ith compound consists of $a_i$ Cs, $b_i$ Nb, of $o_i$ or $s_i$ S atoms, and $c_i$ is its corresponding coefficient. The LP problem is solved with the constraints, $\sum_i a_i c_i = 1, \sum_i b_i c_i = 1, \sum_i o_i c_i = 2, \sum_i s_i c_i = 1,$ $\Sigma o_i c_i = 2, \Sigma s_i c_i = 1,$ ensuring the correct stoichiometry of CsNbO$_2$S with $c_i \geq 0$. Consequently, a compound was determined to be stable by using the database available from Materials Project and ICSD. When estimating the formation energy through Pymatgen, the optimized structure was taken from Materials Project, while the experimental structures of ICSD were relaxed by carrying out DFT calculations at the PBE level. Anion corrections for oxide and sulfide components were included in order to have relative energies consistent with experimental values, since it is known that GGA underestimates the total energies of O$_2$ and S$_8$.

Figure 1A:
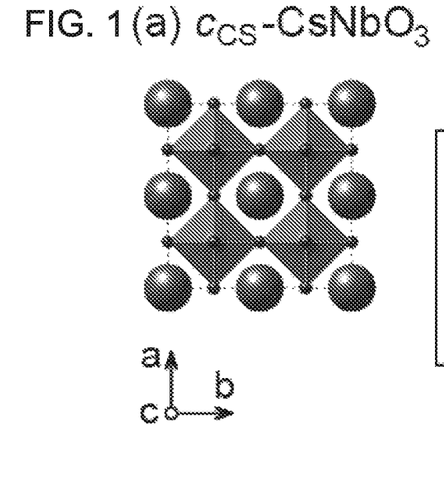
FIG. 1(a) Cubic phase with corner-sharing octahedra and Pm$\bar{3}$m space group (c$_{CS}$-CsNbO$_3$)
Figure 1B:
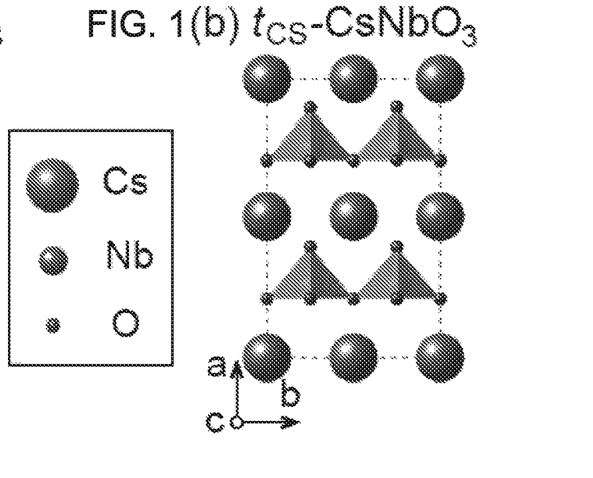
FIG. 1(b) tetragonal phase with corner-sharing square pyramids and P4/mm space group (t$_{CS}$-CsNbO$_3$)
Figure 1C:
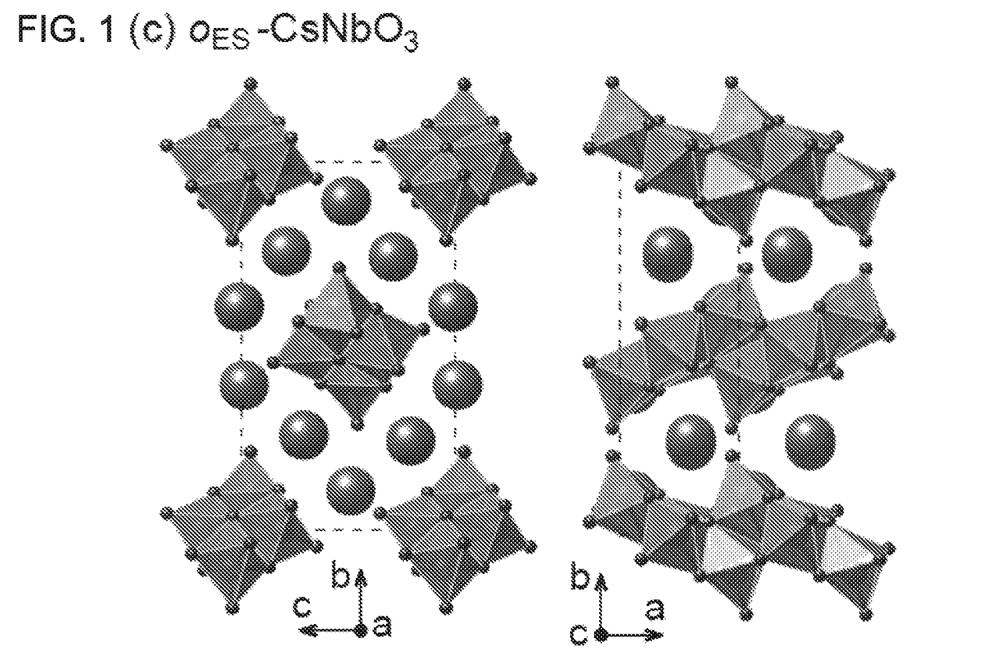
FIG. 1(c) orthorhombic phase with edge-sharing octahedra and P2$_1$/c space group (o$_{ES}$-CsNbO$_3$), the orthorhombic structure was taken from ICSD-1266. The unit cell is marked by dashed lines.

Referring to FIG. 1, CsNbO$_3$ 2×2×2 supercells were obtained by relaxing the atomic coordinates constructed from the prototype cubic and tetragonal perovskite structure. All the supercells contain 40 atoms, with each polymorph being denoted by the structural features as discussed in the followings. The calculated lattice parameters are listed in Table 1. In the cubic phase, the polyhedral network consists of 3D-connected NbO$_6$ octahedra where Nb is at the center and it shares the corners with the adjacent octahedra. This polymorph adopts the cubic phase with space group Pm$\bar{3}$m space group and the octahedra are connected by means of corner-shared (CS). This structure is denoted herein as $c_{CS}$-CsNbO$_3$. In the tetragonal phase, the polyhedral network consists of 2D connected NbO$_5$ square pyramids exhibiting lower dimensional networks, and is denote herein as $t_{CS}$-CsNbO$_3$, as the square pyramids show corner-shared connectivity. This polymorph results from an apical Nb—O bond having the shortest bond in an octahedron, while the opposite apical oxygen atom appears to be too far to form a chemical bond Nb—O by the distance of 4.4 Å. In $t_{CS}$-CsNbO$_3$, the pyramidal coordination provides more room to accommodate the Cs cations than in the cubic phase. Hence, Nb and O form a NbO$_5$ square pyramidal coordination, where the Nb cation is above the square plane, forming a 2D network with the P4/mm space group. In contrast, the experimentally reported polymorph of CsNbO$_3$ with 40 atoms in an orthorhombic unit cell in the P2$_1$/c space group is composed of quasi-1D connected NbO$_6$ octahedra, which are extended in edge shared (ES) way along the a axis. This is denoted herein as $o_{ES}$-CsNbO$_3$.

TABLE 1

Lattice parameters of CsNbO$_3$ depending on the different dimensional structure.

| Compounds | Space group | a (Å) | b (Å) | c (Å) | $\Delta E_{CH}$ (eV/atom) | Volume (Å$^3$) |
|---|---|---|---|---|---|---|
| $c_{CS}$-CSNbO$_3$ | (Cubic) Pm$\bar{3}$m | 8.34 | 8.34 | 8.34 | 250 | 793.9 |
| $t_{CS}$-CSNbO$_3$ | (Tetragonal) P4/mm | 7.78 | 7.78 | 12.45 | 45 | 753.0 |
| $o_{ES}$-CSNbO$_3$ | (Orthorhombic) P2$_1$/c | 5.20 | 9.42 | 16.21 | 0 | 580.4 |

In order to estimate and compare the relative thermodynamic stabilities of the various polymorphs of cesium-niobates CsNbO$_{3-x}$Q$_x$ (Q=S, Se, Te, and x=0, 1, 2, 3), it is necessary to evaluate their convex hull. The convex hull in a phase diagram is constructed from the compounds having the lowest formation energy at a given chemical composition. By definition, a compound whose formation energy is on the convex hull ($\Delta E_{CH}=0$) is intrinsically stable. For other polymorphs with same chemical composition, the distance from the convex hull, $\Delta E_{CH}$, determines their stability. Consequently, it is critical to trach all possible compounds in the reservoir to construct the convex hull. The present inventors have built phase diagrams for CsNbO$_{3-x}$Q$_x$ (Q=S, Se, Te, and x=0, 1, 2, 3) by using data from the Materials Project Database, and complemented the missing compounds by computing additional compounds taken from the Inorganic Crystal Structures Database (ICSD).

The $o_{ES}$-CsNbO$_3$ polymorph is the most favorable among the three phases considered and lies on the convex hull, $\Delta E_{CH}=0$. The energy above the convex hull of the $t_{CS}$-CsNbO$_3$ polymorph is $\Delta E_{CH}=45$ meV/atom, classifying this compound within the scale of metastability. The $t_{CS}$-CsNbO$_3$ tetragonal phase is indeed metastable, since it can accommodate large Cs cations between the corner-shared NbO$_5$ square pyramid in the 2D-network. Furthermore, as predicted from the tolerance factor estimation, the cubic perovskite phase is unstable with $\Delta E_{CH}=250$ meV/atom due to the large ionic radius of Cs that cannot be accommodated between the corner-shared NbO$_6$ octahedra in the 3D-network.

The band gap of sodium niobate oxides could be tuned by oxygen substitution with sulfur, selenium, and tellurium, while preserving the perovskite crystal structures, despite the reduction of stability with respect to their oxide counter parts. Depending on the chalcogen element, the energy level of the valence electrons and the ionic radius influence the electronic structure of the compound without severe geometry alterations. In the present disclosure, as only S, Se, and Te are referred to as chalcogen, discerning from oxygen in CsNbO$_3$ for convenience, the present inventors compared the electronic structures as a function of the chalcogen contents of the anion sites in CsNbO$_{3-x}$Q$_x$ (Q=S, Se, Te, and x=1; 2; 3). In addition, moving for the Q sites from oxygen to chalcogens, variations of the thermodynamic stabilities are expected.

The total energy difference between $c_{CS}$- and $o_{ES}$-phases decreases from 250 meV/atom in CsNbO$_3$ to 136, 128, 115 meV/atom for CsNbS$_3$, CsNbSe$_3$, CsNbTe$_3$, respectively, indicating a stability enhancement trend going down in the group. However, in all cases, $\Delta E_{CH}$ is still over 100 meV/atom, indicating that the $c_{CS}$ phase (cubic perovskites) remains unstable, in agreement with the Goldsmith tolerance factor estimation. Thus, the $o_{ES}$ phase remains the most favorable for all CsNbQ$_3$ (Q=O, S, Se, Te) compounds.

By assuming that the more stable compound has the lower formation energy above the convex hull, the present inventors were able to compare the thermodynamic stabilities at different chemical compositions as well as at the same chemical composition, by relating the DFT enthalpy with those of other elemental, binary, and ternary compounds in the external databases, while including all the possible decomposition channels. (see Table 2 for the lattice parameters and $\Delta E_{CH}$).

TABLE 2

Lattice parameters of chalcogenide compounds depending on the different dimensional structure.

| Compounds | Space group | a (Å) | b (Å) | c (Å) | $\Delta E_{CH}$ (eV/atom) | Volume (Å$^3$) |
|---|---|---|---|---|---|---|
| $c_{CS}$-CsNbO2s | P4/mmm | 9.89 | 8.48 | 8.48 | 402 | 711.91 |
| $c_{CS}$-CsNbOS$_2$ | P4/mmm | 8.12 | 10.17 | 10.17 | 230 | 839.24 |
| $c_{CS}$-CsNbS$_3$ | Pm$\bar{3}$m | 9.92 | 9.92 | 9.92 | 101 | 976.19 |
| $t_{CS}$-CsNbO$_2$S$_{ap}$ | P4/mm | 14.60 | 7.79 | 7.79 | 104 | 885.91 |
| $t_{CS}$-CsNbO2S$_{eq}$ | P4/mm | 12.32 | 7.56 | 9.84 | 64 | 916.18 |
| $t_{CS}$-CsNbOS$_2$ | I4/mcm | 13.20 | 8.98 | 8.97 | 34 | 1062.98 |
| $t_{CS}$-CsNbS$_3$ | I4/mcm | 14.75 | 9.01 | 9.01 | 16 | 1198.20 |
| $o_{ES}$-CsNbO$_2$S | P21/c | 5.13 | 17.91 | 10.89 | −26 | 999.58 |
| $o_{ES}$-CsNbOS$_2$ | P21/c | 6.22 | 16.64 | 10.69 | 4 | 1103.45 |
| $o_{ES}$-CsNbS$_3$ | P21/c | 6.44 | 18.48 | 10.76 | −35 | 1267.63 |
| $c_{CS}$-CsNbO$_2$Se | P4/mmm | 10.34 | 8.57 | 8.57 | 511 | 758.66 |
| $c_{CS}$-CsNbOSe$_2$ | P4/mmm | 8.06 | 10.74 | 10.74 | 233 | 930.69 |
| $c_{CS}$-CsNbSe$_3$ | Pm$\bar{3}$m | 10.41 | 10.41 | 10.41 | 96 | 1129.02 |
| $t_{CS}$-CsNbO$_2$Se$_{ap}$ | P4/mm | 15.10 | 7.80 | 7.89 | 132 | 928.97 |
| $t_{CS}$-CsNbO$_2$Se$_{eq}$ | P4/mm | 12.87 | 7.63 | 10.17 | 72 | 999.63 |
| $t_{CS}$-CsNbOSe$_2$ | I4/mcm | 13.60 | 9.35 | 9.35 | 25 | 1188.42 |
| $t_{CS}$-CsNbSe$_3$ | I4/mcm | 15.30 | 9.41 | 9.41 | 6 | 1356.35 |
| $o_{ES}$-CsNbO$_2$Se | P2$_1$/c | 5.13 | 18.37 | 11.29 | −14 | 1063.32 |
| $o_{ES}$-CsNbOSe$_2$ | P2$_1$/c | 6.50 | 17.24 | 10.94 | 17 | 1222.42 |
| $o_{ES}$-CeCsNbSe$_3$ | P2$_1$/c | 6.87 | 18.83 | 11.10 | −32 | 1412.35 |
| $c_{CS}$-CsNbO$_2$Te | P4/mmm | 11.05 | 8.76 | 8.76 | 788 | 848.22 |
| $c_{CS}$-CsNbOTe$_2$ | P4/mmm | 8.00 | 11.71 | 11.71 | 285 | 1097.29 |
| $c_{CS}$-CsNbTe$_3$ | Pm$\bar{3}$m | 11.19 | 11.19 | 11.19 | 194 | 1402.53 |
| $t_{CS}$-CsNbO$_2$Te$_{ap}$ | P4/mm | 15.96 | 7.88 | 8.01 | 216 | 1007.22 |
| $t_{CS}$-CsNbO$_2$Te$_{eq}$ | P4/mm | 13.85 | 7.68 | 10.70 | 113 | 1138.96 |
| $t_{CS}$-CsNbOTe$_2$ | I4/mcm | 14.29 | 9.98 | 9.98 | 58 | 1423.79 |
| $t_{CS}$-CsNbTe$_3$ | I4/mcm | 15.29 | 10.19 | 10.19 | 88 | 1588.11 |
| $o_{ES}$-CsNbO$_2$Te | P2$_1$/c | 5.16 | 19.84 | 11.71 | 28 | 1198.72 |
| $o_{ES}$-CsNbOTe$_2$ | P2$_1$/c | 7.02 | 17.28 | 12.14 | 94 | 1471.76 |
| $o_{ES}$-CsNbTe$_3$ | P2$_1$/c | 7.31 | 19.89 | 11.75 | 79 | 1674.50 |

After careful comparison to existing databases, the present inventors found unreported stable phases with edge sharing configuration for $o_{ES}$-CsNbS$_3$ and $o_{ES}$-CsNbSe$_3$ displaying negative $\Delta E_{CH}$ compared to existing phases. From this point on, the present inventors included these two stable compounds in the phase diagram of chalcogenides during the assessment of the thermodynamic stability of the quaternary compounds, such as CsNbO$_{3-x}$S$_x$ and CsNbO$_{3-x}$Se$_x$ (x=1,2).

In the $c_{CS}$-CsNbO$_3$, as the O atom in the Nb—O bond parallel to the a-axis is denoted as apical O, the apical O atoms are replaced with chalcogen atoms, so as to obtain CsNbO$_2$Q. Furthermore, the present inventors substituted the O atoms of the Nb—O bond perpendicular to a-axis equatorial O, in CsNbOQ$_2$. The present inventors found that the structure preserves the 3D network with P4/mmm space group. However, all $c_{CS}$-compounds are unstable by $\Delta E_{CH}$>200 meV/atom.

Figure 2:
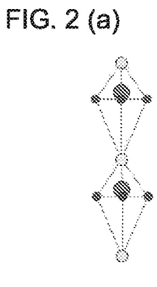

To determine the preferred location of Q in $t_{CS}$-CsNbO$_2$Q, two sets of calculations were performed, where the apical O atoms and the equatorial O atoms were substituted. The O—Nb bonds of the apical and equatorial bonds are along the a- and b-axis, respectively. For $t_{CS}$-CsNbO$_2$Q, the equatorial-substituted structures (FIG. 2b) were more favorable than the apical-substituted one (FIG. 2a) for all the chalcogens. When the present inventors relaxed CsNbOQ$_2$, structures could be obtained where all Q atoms are at the equatorial sites in I4/mcm space group by octahedra rotation (see FIG. 2c). From the quasi-1D-connected octahedra of $o_{ES}$-CsNbO$_3$, the outer O atoms form the shortest Nb—O bonds, while they belong to only one octahedron and do not participate in the edge-sharing structural feature. The Nb cations are shifted from the center of each octahedron in the outward direction from the chain of octahedra. The other O atoms are shared with the neighboring octahedra, being distinguished from the outer O. The outer and the other O atoms are substituted with Q atoms for $o_{ES}$-CsNbO$_2$Q and $o_{ES}$-CsNbOQ$_2$, respectively. Two octahedra of $o_{ES}$-CsNbO$_2$Q and $o_{ES}$-CsNbOQ$_2$ are shown in FIG. 2d-e, respectively.

Regarding the thermodynamic stabilities as a function of the chalcogen content, the present inventors estimated the energy above the convex hull. $\Delta E_{CH}$ of $t_{CS}$- and $o_{ES}$-compounds are measured in FIG. 2f, as $c_{CS}$-compounds having $\Delta E_{CH}$>200 meV/atom are excluded. In $t_{CS}$-CsNbO$_2$Q compounds, the present inventors noted that the structure is more favorable when chalcogen is at the equatorial site. Hence, only $t_{CS}$-CsNbO$_2$Q where Q is at the equatorial is marked in FIG. 2f. It should also be noted that when the present inventors estimated the energy above the convex hull for oxysulfide and oxyselenide compounds, the computed formation energy of $o_{ES}$-CsNbS$_3$ and $o_{ES}$-CsNbSe$_3$ was added into the phase diagram.

According to the $\Delta E_{CH}$, the oxysulfide and oxyselenide compounds appear to be more stable than oxytelluride ones. The largest difference of formation energies between $t_{CS}$- and $o_{ES}$-compounds are 98 and 97 meV/atom for CsNbO$_2$S and CsNbO$_2$Se, respectively. $t_{CS}$-CsNbO$_2$S and $t_{CS}$-CsNbO$_2$Se are on the border of the criterion, $\Delta E_{CH}$<100 meV/atom. Having the largest ionic radius, when tellurium is substituted as oxytelluride and telluride compounds, the stability decreases. $o_{ES}$-CsNbO$_2$Q and $o_{ES}$-CsNbOQ$_2$ compounds also are stable by $\Delta E_{CH}$<17 meV/atom.

Figures 3A, 3B:
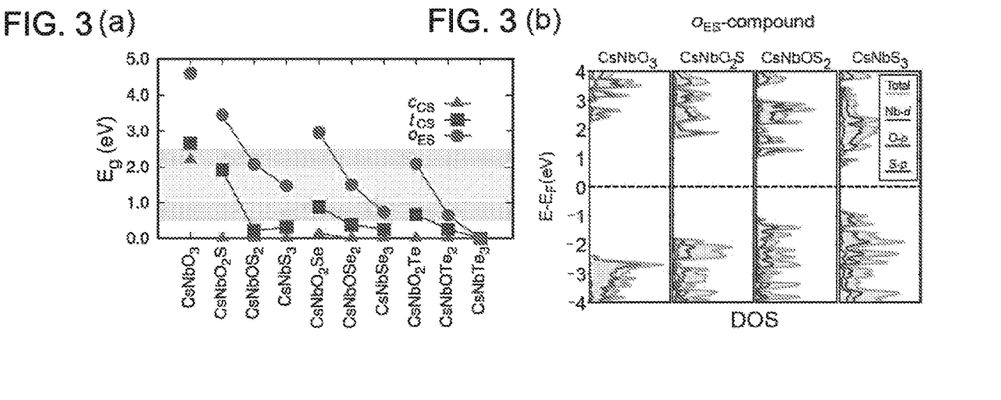
FIG. 3(a) is a graph plotting band gaps calculated at the HSE06 level for CsNbO$_{3-x}$Q$_x$ (Q=S, Se, or Te, and x=0, 1, 2, or 3)
FIG. 3(b) is a graph plotting site-projected density of states of o$_{ES}$-compounds (HSE06 calculation), showing that the valence edge is dominated by the valence states of the anions.

The present inventors calculated the band gaps using the HSE06 functional. FIG. 3a shows the influence on the band gaps of both the content of the chalcogens and the type of polymorph. Comparing between results from PBE and PBE with spin-orbit coupling (PBE+SOC) functionals (Table 3), it was found that the SOC effect is negligible, due to the metallic character of $c_{CS}$-compounds and the low symmetry $t_{CS}$- and $o_{ES}$-compounds. Therefore, the SOC effect was not taken into account in band gap calculations at the HSE06 level. The band gaps are presented as a function of their chemical composition and structure dimensionality. The band gap of $t_{CS}$-CsNbO$_2$Q is reported for only structure where Q is at the equatorial site, because it is more stable than the structure where Q is at the apical one.

TABLE 3

Computed band gaps ($E_g$) at the PBE, PBE with spin-orbit coupling (SOC), and HSE06 functional level.

| Compounds | Band Gaps (eV) | | |
|---|---|---|---|
| | PBE | PBE + SOC | HSE06 |
| $c_{CS}$-CsNbO$_3$ | 1.39 | 1.26 | 2.20 |
| $c_{CS}$-CsNbO$_2$S | 0.0 | | 0.0 |
| $c_{CS}$-CsNbO$_2$Se | 0.0 | | 0.13 |
| $c_{CS}$-CsNbO$_2$Te | 0.0 | | 0.0 |
| $c_{CS}$-CsNbOS$_2$ | 0.0 | | 0.0 |
| $c_{CS}$-CsNbOSe$_2$ | 0.0 | | 0.0 |
| $c_{CS}$-CsNbOTe$_2$ | 0.0 | | 0.0 |
| $c_{CS}$-CsNbS$_3$ | 0.0 | | 0.0 |
| $c_{CS}$-CsNbSe$_3$ | 0.0 | | 0.0 |
| $c_{CS}$-CsNbTe$_3$ | 0.0 | | 0.0 |
| $t_{CS}$-CsNbO$_3$ | 1.62 | 1.61 | 2.66 |
| $t_{CS}$-CsNbO$_2$S | 1.19 | 1.18 | 1.93 |
| $t_{CS}$-CsNbO$_2$Se | 0.72 | 0.68 | 0.88 |
| $t_{CS}$-CsNbO$_2$Te | 0.53 | 0.52 | 0.67 |
| $t_{CS}$-CsNbOS$_2$ | 0.35 | 0.35 | 0.22 |
| $t_{CS}$-CsNbOSe$_2$ | 0.20 | 0.24 | 0.39 |
| $t_{CS}$-CsNbOTe$_2$ | 0.27 | 0.19 | 0.26 |
| $t_{CS}$-CsNbS$_3$ | 0.08 | | 0.32 |
| $t_{CS}$-CsNbSe$_3$ | 0.0 | | 0.26 |
| $t_{CS}$-CsNbTe$_3$ | 0.0 | | 0.0 |
| $o_{ES}$-CsNbO$_3$ | 3.34 | 3.32 | 4.60 |
| $o_{ES}$-CsNbO$_2$S | 2.58 | 2.56 | 3.45 |
| $o_{ES}$-CsNbO$_2$Se | 2.21 | 2.17 | 2.96 |
| $o_{ES}$-CsNbO$_2$Te | 1.55 | 1.46 | 2.09 |
| $o_{ES}$-CsNbOS$_2$ | 1.37 | 1.47 | 2.07 |
| $o_{ES}$-CsNbOSe$_2$ | 0.94 | 0.99 | 1.50 |
| $o_{ES}$-CsNbOTe$_2$ | 0.31 | 0.34 | 0.65 |
| $o_{ES}$-CsNbS$_3$ | 0.92 | | 1.47 |
| $o_{ES}$-CsNbSe$_3$ | 0.33 | | 0.80 |
| $o_{ES}$-CsNbTe$_3$ | 0.0 | | 0.0 |

Among the $c_{CS}$-compounds, which are unstable according to the $\Delta E_{CH}$ estimation, only $c_{CS}$-CsNbO$_3$ shows a finite band gap, while the other $c_{CS}$-compounds are mostly metallic or their band gap approach zero, by the introduction of chalcogen atoms. The present inventors hence focused on the low dimensional compounds. In summary, a low dimensionality results in finite band gaps.

FIG. 3b shows the site-projected DOS (density of states) of $o_{ES}$-compounds, as oxygen anions are substituted with sulfur anions in $o_{ES}$-CsNbO$_3$. It can be seen that low-lying conduction band is localized over the d orbitals of the Nb cation. At the same time, the valence p orbitals of the anions are responsible for the valence band. The figure also shows the influence of the higher level of the p orbitals in the chalcogen atoms. It is apparent from the figure that sulfurization narrows the band gap. Thus, after full sulfurization of the $o_{ES}$-compound the band gap becomes 1.47 eV, decreasing by over 3 eV from the wide band gap of CsNbO$_3$. The band gap reduction for selenium and tellurium can be noticed as well; in $o_{ES}$-CsNbSe$_3$ the band gap decreases down to 0.73 eV, while CsNbTe$_3$ is a metal.

Figures 4A, 4B:
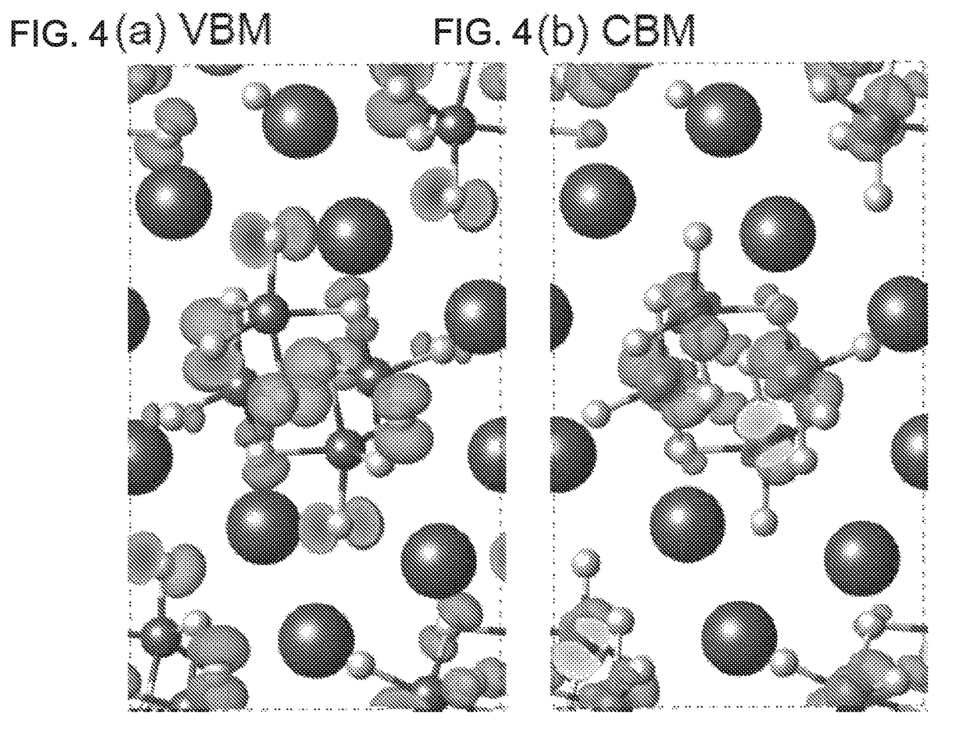
FIGS. 4(a)-4(b) illustrate projected charged density of o$_{ES}$-CsNbS$_3$ at FIG. 4(a) the valence band maximum (VBM) and FIG. 4(b) conduction band maximum (CBM).
Figure 5:
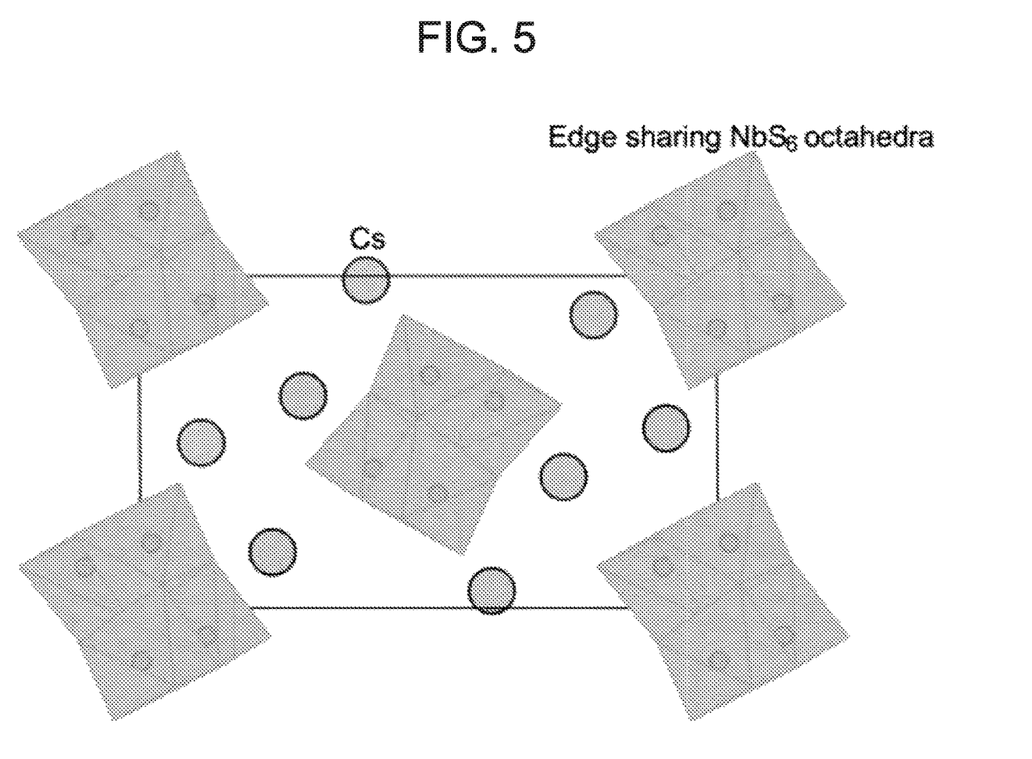
FIG. 5 shows the structure of o$_{ES}$-CsNbS$_3$.
Figure 6:
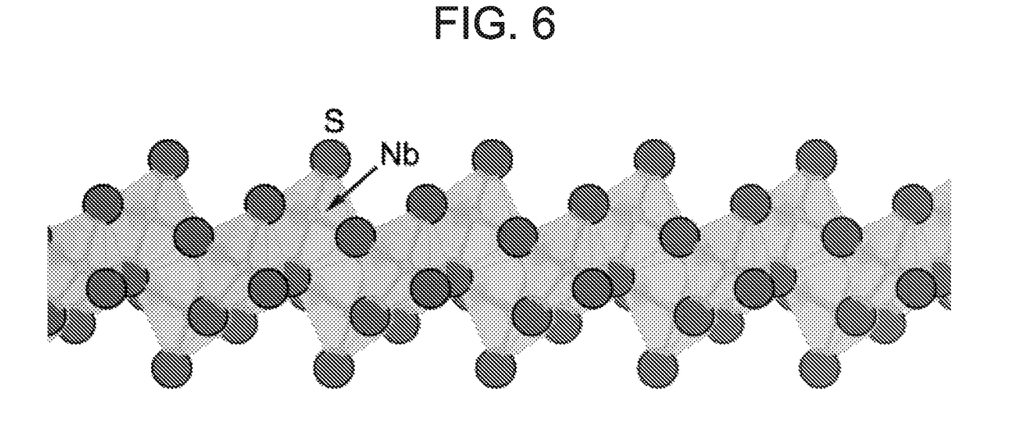
FIG. 6 shows details of the edge-sharing octahedral (NbS$_6$).

As shown in FIG. 4, the partial charge densities of $o_{ES}$-CsNbS$_3$ at the band edges show little contribution of Cs to the states in either the valence band maximum (VBM) or conduction band maximum (CBM). This implies that Cs is still quite ionic even though the sulfur is less electronegative than oxygen. Thus, Cs cations play a considerably structural role only to form low-dimensional network of Nb and O bonds, while the Nb and Q influence mainly the electronic structures. The structure of $o_{ES}$-CsNbS$_3$ is shown in FIG. 5 and the details of the edge-sharing octahedral (NbS$_6$) are shown in FIG. 6.

Figure 7:
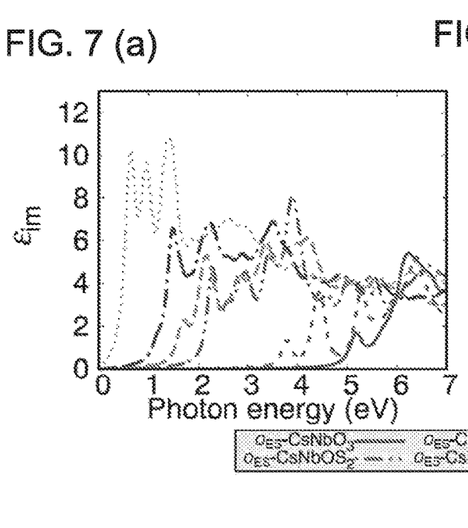
FIG. 7(a) is a graph plotting HSE06 computed imaginary part of the dielectric function.
FIG. 7(b) is a graph plotting absorption coefficient of the selected compounds. The dielectric functions are taken from the tensor elements xx and yy for t$_{CS}$- and o$_{ES}$-compounds, respectively. This direction shows the onset of the absorption in an energy lower than for other directions.
Figure 8A:
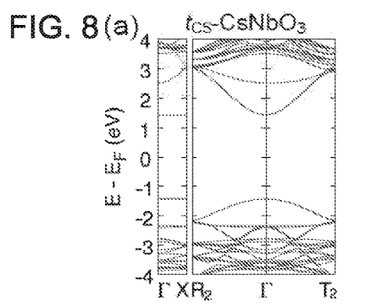
FIGS. 8(a)-8(c) are graphs plotting the band structures of t$_{CS}$-CsNbO$_3$ (FIG. 8(a)), o$_{ES}$-CsNbO$_3$ (FIG. 8(b)), and o$_{ES}$-CsNbS$_3$ (FIG. 8(c)).
Figure 8B:
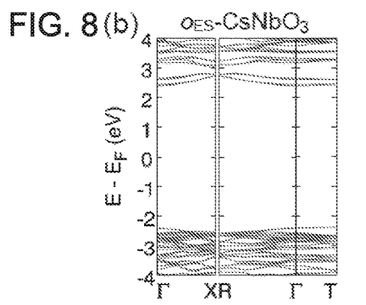
Figure 8C:
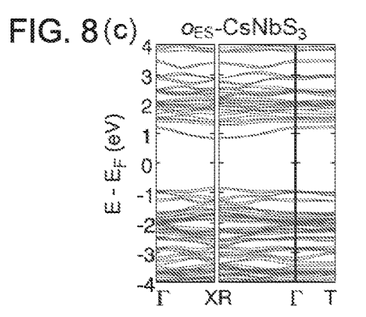

FIG. 7 shows the dielectric function of the selected compounds. The fully chalcogenized compounds, such as $o_{ES}$-CsNbS$_3$ and $o_{ES}$-CsNbSe$_3$, show a relatively high ability to absorb photons at much lower region than $o_{ES}$-CsNbO$_3$. The absorption onset might occur between the valence band and the conduction band at the X point in the first Brillouin zone, as seen in the band structure of $o_{ES}$-CsNbS$_3$ in FIG. 8c. The valence band maximum (VBM) and conduction band maximum (CBM) are contributed mainly by the S 3p and Nb 4d states, respectively.

Figure 9A:
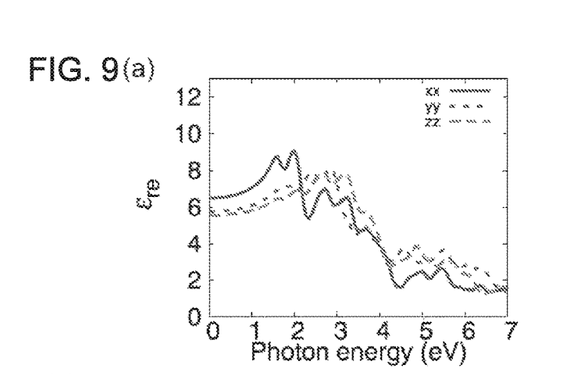
FIG. 9(a) Real and FIG. 9(b) imaginary part of the dielectric function, and FIG. 9(c) absorption coefficient.
Figure 9B:
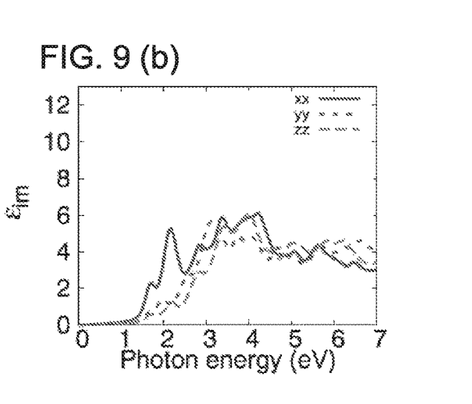
Figure 9C:
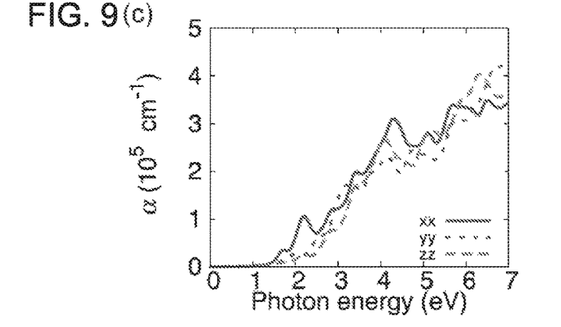

Since the dielectric function of $o_{ES}$-CsNbS$_3$ depends on the direction, as shown in FIG. 9, the present inventors concluded that the compounds are optically anisotropic. This is the result of the electronic structure, which displays the connectivities between the adjacent NbS$_6$ octahedra being formed in quasi-1 dimensionality. As the octahedra are repeating along the [1 0 0] direction sharing the edges, the onset of the absorption is mostly along this direction.

Figure 8D:
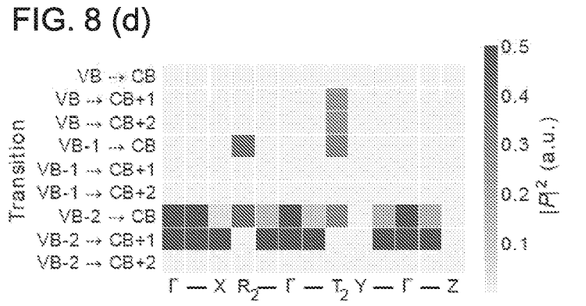
FIG. 8(d)-8(f) are graphs plotting transition matrix elements (in arbitrary units) of t$_{CS}$-CsNbO$_3$ (FIG. 8(d)), o$_{ES}$-CsNbO$_3$ (FIG. 8(e)) and o$_{ES}$-CsNbS$_3$ (FIG. 8(f)) between the valence bands (VB) and the conduction band (CB), and between the adjacent bands near the edges. The k-points of Γ (0,0,0), X (½,0,0), Y (0,½,0), Z (0,0,½), R (½,½,½), T (0,½,½) in the first Brillouin zone are selected. Calculations have been performed at the HSE06 level.
Figure 8E:
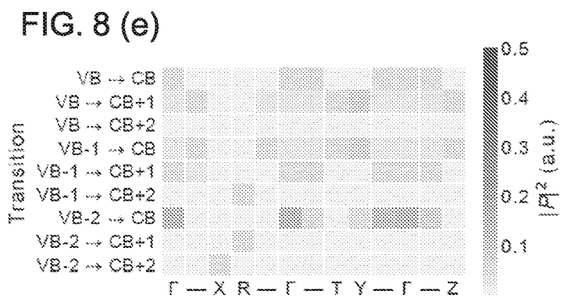
Figure 8F:
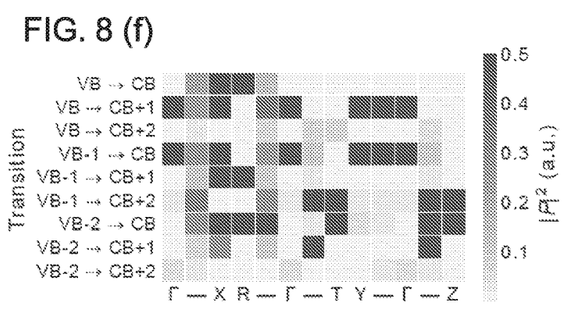
Figure 10:
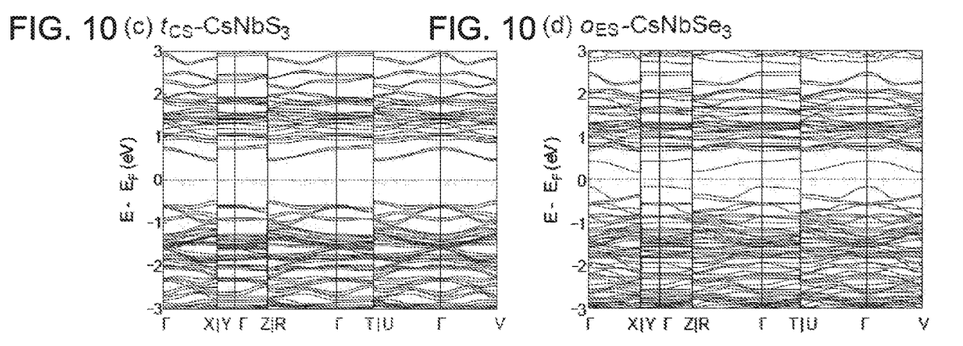
FIGS. 10(a)-10(d) are graphs plotting, at the PBE level, calculated band structure of FIG. 10(a) t$_{CS}$-CsNbO$_3$, FIG. 10(b) o$_{ES}$-CsNbO$_3$, FIG. 10(c) o$_{ES}$-CsNbS$_3$, and FIG. 10(d) o$_{ES}$-CsNbSe$_3$. In the band structures Γ (0,0,0), X (½,0,0), Y (0,½,0), Z (0,0,½), R (½,½,½), T (0,½,½), U (½,0,½), and V (½,½,0) points are selected in the first Brillouin zone for the path by using SeeK-path.

Unexpectedly, $t_{CS}$-compounds show much weaker absorption and the absorption onset is even higher than the band gap. For example, although the band gap of $t_{CS}$-CsNbO$_3$ is 2.66 eV, the onset for the absorption is located at over 3.5 eV. The band structure shows the direct optical transition for $t_{CS}$-CsNbO$_{3-x}$S$_x$ compounds. (see FIG. 10a). However, there is no noticeable absorption below 3.5 eV. Only a weak transition between the valence band (VB) and the conduction band (CB) can be seen, as the dipole transition matrix is shown in FIG. 8d. This indicates that the absorption around the edges is forbidden in $t_{CS}$-compounds. Furthermore, the onset of the absorption occurs between the VB and the CB+1, and between the VB-1 (VB-2) and the CB along the path of the k-points T-R. On the other hand, the band edges of $o_{ES}$-CsNbS$_3$ contribute to the strong transition at the X and R point, as shown in FIG. 8f. It should be noted that $o_{ES}$-CsNbS$_3$ and $o_{ES}$-CsNbSe$_3$ are found stable, namely $\Delta E_{CH}$<0. Thus, $o_{ES}$-CsNbS$_3$ and $o_{ES}$-CsNbSe$_3$ are proposed as new semiconducting materials for applications in solar cells, photocatalysts, photoelectrodes, and light-emitting diodes.

In summary, although niobate perovskites had been suggested as ferroelectric and photoactive compounds, there has not been any report on the experimental synthesis of CsNbO$_3$ perovskite. The tolerance factor of CsNbO$_3$ indicates that the ionic radius of Cs cation is too large to be accommodated in the cavity of the NbO$_6$ networks. In the present disclosure, the inventors quantified and explained the thermodynamic stabilities of different polymorphs of CsNbO$_3$ in polyhedral networks extended across the three dimensional space or restricted along specific directions. The present inventors found that CsNbO$_3$ in the cubic perovskite structure is unstable. However, the tetragonal phase where 2D connected NbO$_5$ square pyramids are formed by corner-shared networks is metastable. Nonetheless, the optical absorption of CsNbO$_3$ in the tetragonal phase is weak in the visible light region. In an attempt to stabilize the perovskite structure and reduce the band gaps, the chemical composition of the structures was altered by introducing chalcogen atoms, such as S, Se, and Te at the O anion sites. The present inventors found, by comparison with thermochemistry databases, that CsNbS$_3$ and CsNbSe$_3$ in the orthorhombic phase where the octahedra are connected with the adjacent by sharing the corners (quasi-1D), are possibly new stable materials, according to the computed convex hull energies. In addition, the quasi-1D compounds in the orthorhombic phase have lower band gap with strong absorption peak. Taking into account polymorphism, thermodynamic stability and strong absorption in the visible light region, the present disclosure highlights an alternative approach to the discovery of lead-free semiconducting materials with enhanced optical properties.

Figure 11:
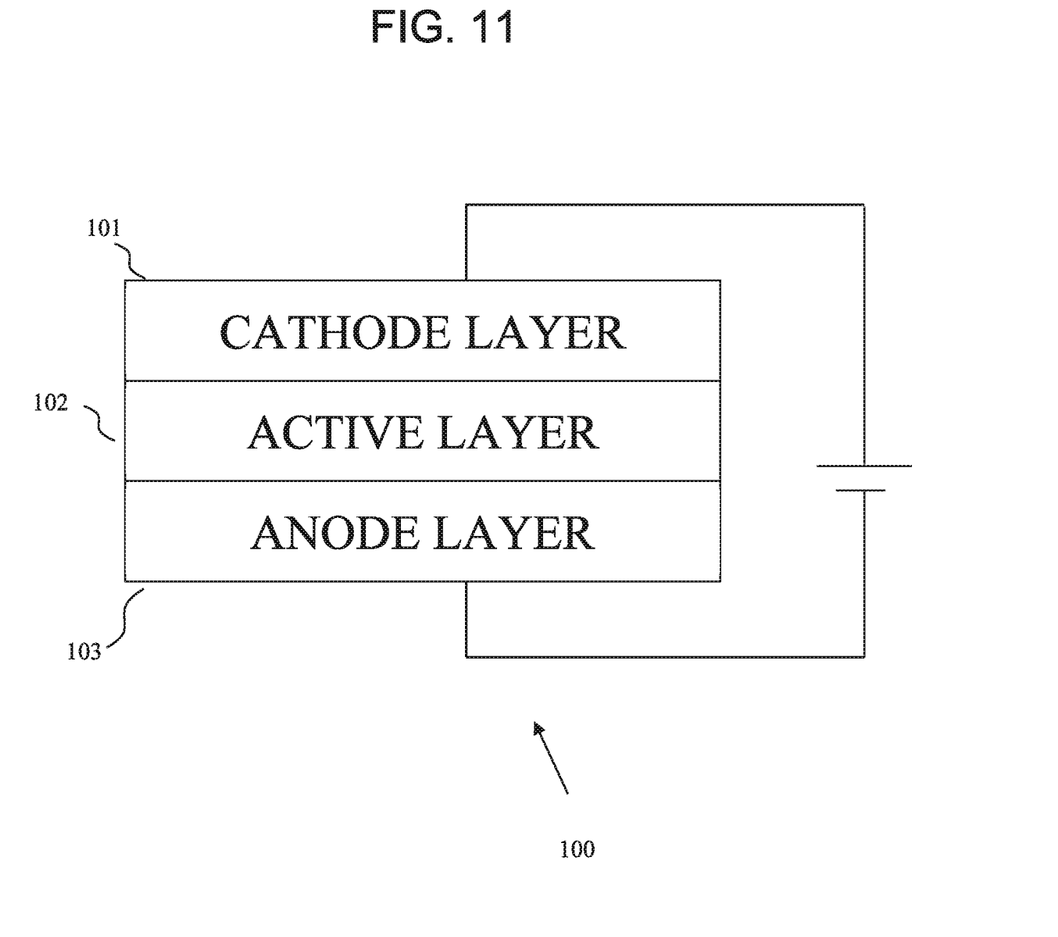
FIG. 11 is a cross section side view illustrating an embodiment of a semiconductor device.

FIG. 11 illustrates one implementation of the structure and operating principle of a semiconductor device 100. In implementations, an semiconductor device 100 can include, but are not limited to, optoelectronic devices such as solar cells, photocatalysts, photoelectrodes, light-emitting diodes, photoelectrodes, and so forth. As shown in FIG. 11, the semiconductor device 100 may include a cathode layer 101, an anode layer 103, and an active layer 102 disposed between the cathode layer 101 and the anode layer 103. The cathode layer 101 functions as a cathode electrode. The anode layer 103 can include an anode electrode.

In some specific embodiments, the cathode layer 101 can include an Al layer and/or a Ag layer that functions as a cathode, and the anode layer 103 can include an indium-tin oxide (ITO) layer that functions as an anode. In other specific embodiments, the cathode layer 101 can include an indium-tin oxide (ITO) layer that functions as a cathode, and the anode layer 103 can include an aluminum layer that functions as an anode. Other materials may also be used to form the cathode layer 101, such as calcium, magnesium, lithium, sodium, potassium, strontium, cesium, barium, iron, cobalt, nickel, copper, silver, zinc, tin, samarium, ytterbium, chromium, gold, graphene, an alkali metal fluoride, an alkaline-earth metal fluoride, an alkali metal chloride, an alkaline-earth metal chloride, an alkali metal oxide, an alkaline-earth metal oxide, a metal carbonate, a metal acetate, and/or a combination of two or more of the above materials. Further, other materials may be used to form the anode layer 103 (or a transparent electrode), such as fluorine-doped tin oxide (FTO), aluminum-doped zinc oxide (AZO), antimony-tin mixed oxide (ATO), a conductive polymer, a network of metal nanowire, a network of carbon nanowire, nanotube, nanosheet, nanorod, carbon nanotube, silver nanowire, or graphene.

The active layer 102 can include a cesium-niobium-chalcogenide compound selected from the group consisting of CsNbS$_3$, CsNbSe$_3$, and CsNbO$_{x-3}$Q$_x$ (Q=S, Se, and x=1, 2) compounds, wherein the cesium-niobium-chalcogenide compound comprises an edge-shared orthorhombic crystal structure. The band gaps of the cesium-niobium-chalcogenide compounds are suitable for absorption of the visible light, expanding their applicability in various semiconductor applications including photovoltaics where the thermodynamic stability is strongly required.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A composition comprising:
a cesium-niobium-chalcogenide compound selected from the group consisting of CsNbS$_3$, CsNbSe3, and CsNbO$_{3-x}$Q$_x$, where Q is S or Se, and x is 1 or 2, wherein the cesium-niobium-chalcogenide compound includes an edge-shared orthorhombic crystal structure.

2. The composition according to claim 1, wherein the edge-shared orthorhombic crystal structure shares edges along a [1 0 0] direction.

3. The composition according to claim 1, wherein the cesium-niobium-chalcogenide compound is thermodynamically stable.

4. The composition according to claim 1, wherein the cesium-niobium-chalcogenide compound is CsNbS$_3$.

5. The composition according to claim 1, wherein the cesium-niobium-chalcogenide compound is CsNbSe$_3$.

6. The composition according to claim 1, wherein the cesium-niobium-chalcogenide compound is CsNbO$_{3-x}$Q$_x$, where Q is S or Se, and x is 1 or 2.

7. A semiconductor device comprising:
a cathode layer;
an anode layer; and
an active layer disposed between the cathode layer and the anode layer, wherein the active layer includes a cesium-niobium-chalcogenide compound selected from the group consisting of CsNbS$_3$, CsNbSe3, and CsNbO$_{3-x}$Q$_x$, where Q is S or Se, and x is 1 or 2, and wherein the cesium-niobium-chalcogenide compound comprises an edge-shared orthorhombic crystal structure.

8. The semiconductor device of claim 7, wherein the semiconductor device includes an optoelectronic device.

9. The semiconductor device of claim 7, wherein the semiconductor device includes a solar cell device.

10. The semiconductor device of claim 7, wherein the cathode layer includes one or both of an Al layer and a Ag layer.

11. The semiconductor device of claim 7, wherein the anode layer includes one or more of indium-tin oxide, fluorine-doped tin oxide, aluminum-doped zinc oxide, antimony-tin mixed oxide, a conductive polymer and a nanowire.

12. The semiconductor device of claim 7, wherein the edge-shared orthorhombic crystal structure shares edges along a [1 0 0] direction.

13. The semiconductor device of claim 7, wherein the cesium-niobium-chalcogenide compound is thermodynamically stable.

14. The semiconductor device of claim 7, wherein the cesium-niobium-chalcogenide compound is CsNbS$_3$.

15. The semiconductor device of claim 7, wherein the cesium-niobium-chalcogenide compound is CsNbSe$_3$.

16. The semiconductor device of claim 7, wherein the cesium-niobium-chalcogenide compound is CsNbO$_{3-x}$Q$_x$, where Q is S or Se, and x is 1 or 2.

* * * * *